(12) United States Patent
Ikeda

(10) Patent No.: US 12,482,728 B2
(45) Date of Patent: Nov. 25, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Satoru Ikeda, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 599 days.

(21) Appl. No.: 17/902,053

(22) Filed: Sep. 2, 2022

(65) Prior Publication Data

US 2023/0298975 A1 Sep. 21, 2023

(30) Foreign Application Priority Data

Mar. 21, 2022 (JP) .................................. 2022-044781

(51) Int. Cl.
*H01L 23/495* (2006.01)
*H01L 23/00* (2006.01)

(52) U.S. Cl.
CPC ........ *H01L 23/49513* (2013.01); *H01L 24/29* (2013.01); *H01L 24/32* (2013.01);
(Continued)

(58) Field of Classification Search
CPC ........... H01L 23/3107; H01L 23/49562; H01L 24/40; H01L 23/49513; H01L 24/73; H01L 24/32; H01L 23/49524; H01L 24/83; H01L 24/29; H01L 23/4824; H01L 24/05; H01L 23/49575; H01L 24/06; H01L 23/49568; H01L 23/3735; H01L 23/4334; H01L 23/49531; H01L 21/4825; H01L 21/565;
(Continued)

(56) References Cited

U.S. PATENT DOCUMENTS 8,896,131 B2 * 11/2014 Bhalla ................ H03K 17/0406
257/692
2013/0241040 A1 * 9/2013 Tojo ...................... H01L 23/051
438/123

(Continued)

FOREIGN PATENT DOCUMENTS

JP H11-26460 A 1/1999
JP 2005-101293 A 4/2005

(Continued)

OTHER PUBLICATIONS

Notice of Allowance received in Japanese Patent Application No. 2022-044781 dated Mar. 4, 2025 in 6 pages.

*Primary Examiner* — Mouloucoulaye Inoussa
(74) *Attorney, Agent, or Firm* — Knobbe, Martens, Olson & Bear, LLP

(57) ABSTRACT

A semiconductor device of an embodiment includes a lead frame; a first bonding material; a semiconductor chip including a lower surface, an upper surface, a first electrode connected to the first bonding material, a second electrode provided on the upper surface, and electrode pads connected to the second electrode; second bonding materials provided on each of the electrode pads; and a first connector connected to at least one of the second bonding materials, wherein the second bonding material which is not connected to the first connector is not connected to a connector or a wire.

17 Claims, 16 Drawing Sheets

(52) U.S. Cl.
CPC .............. *H01L 24/40* (2013.01); *H01L 24/73* (2013.01); *H01L 24/05* (2013.01); *H01L 2224/05155* (2013.01); *H01L 2224/05644* (2013.01); *H01L 2224/29111* (2013.01); *H01L 2224/29116* (2013.01); *H01L 2224/29117* (2013.01); *H01L 2224/2912* (2013.01); *H01L 2224/29138* (2013.01); *H01L 2224/29139* (2013.01); *H01L 2224/29144* (2013.01); *H01L 2224/32245* (2013.01); *H01L 2224/40179* (2013.01); *H01L 2224/73221* (2013.01); *H01L 2224/73263* (2013.01); *H01L 2224/73265* (2013.01)

(58) Field of Classification Search
CPC ..... H01L 23/49527; H01L 2224/05155; H01L 2224/29138; H01L 2224/05644; H01L 2224/40179; H01L 2224/29111; H01L 2224/32245; H01L 2224/29117; H01L 2224/29144; H01L 2224/2912; H01L 2224/29116; H01L 2224/29139; H01L 2224/73263; H01L 2224/73221; H01L 2224/73265; H01L 2924/10253; H01L 2924/181; H01L 2224/0603; H01L 2924/18301; H01L 2224/05624; H01L 2224/40139; H01L 2224/05614; H01L 2224/29101; H01L 2924/13091; H01L 2224/05647; H10D 62/393; H10D 89/60; H10D 84/148; H10D 30/665; H10D 30/667; H10D 30/668; H10D 30/0291; H10D 62/83; H10D 62/112; H10D 62/105; H10D 64/62; H03K 17/74; H03K 17/08142

See application file for complete search history.

(56) References Cited

U.S. PATENT DOCUMENTS

| | | | |
|---|---|---|---|
| 2015/0179551 | A1 | 6/2015 | Nakamura et al. |
| 2016/0005703 | A1* | 1/2016 | Nakata .................... H01L 24/37 257/779 |
| 2017/0092596 | A1* | 3/2017 | Yoshihara ......... H01L 23/49579 |
| 2017/0170100 | A1 | 6/2017 | Yato et al. |
| 2017/0179108 | A1 | 6/2017 | Okuda et al. |
| 2018/0138136 | A1* | 5/2018 | Tonegawa ............ H10D 64/256 |
| 2019/0341339 | A1 | 11/2019 | Fujita et al. |
| 2020/0295180 | A1 | 9/2020 | Ichinoseki et al. |
| 2020/0343106 | A1* | 10/2020 | Usui ....................... H01L 24/32 |
| 2021/0313253 | A1* | 10/2021 | Ogawa ............. H01L 23/49816 |
| 2022/0406745 | A1* | 12/2022 | Pavlicek ................. H01L 24/73 |

FOREIGN PATENT DOCUMENTS

| | | |
|---|---|---|
| JP | 2007-035913 A | 2/2007 |
| JP | 4193423 B2 | 12/2008 |
| JP | 2017-147433 A | 8/2017 |
| JP | 6451426 B2 | 1/2019 |
| JP | 2019-195013 A | 11/2019 |
| JP | 2020-150200 A | 9/2020 |
| WO | WO 2014/115561 A1 | 7/2014 |

* cited by examiner

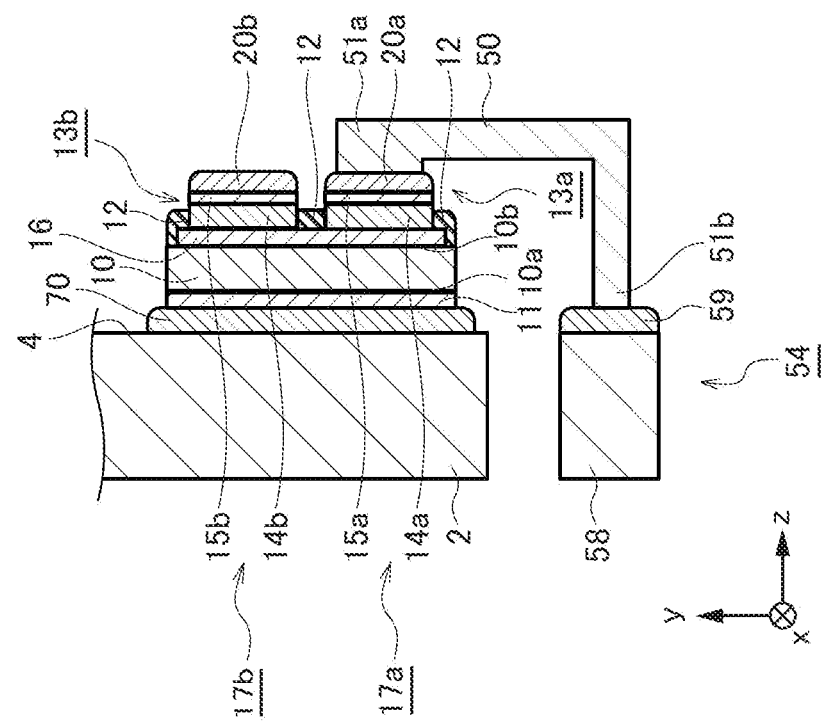

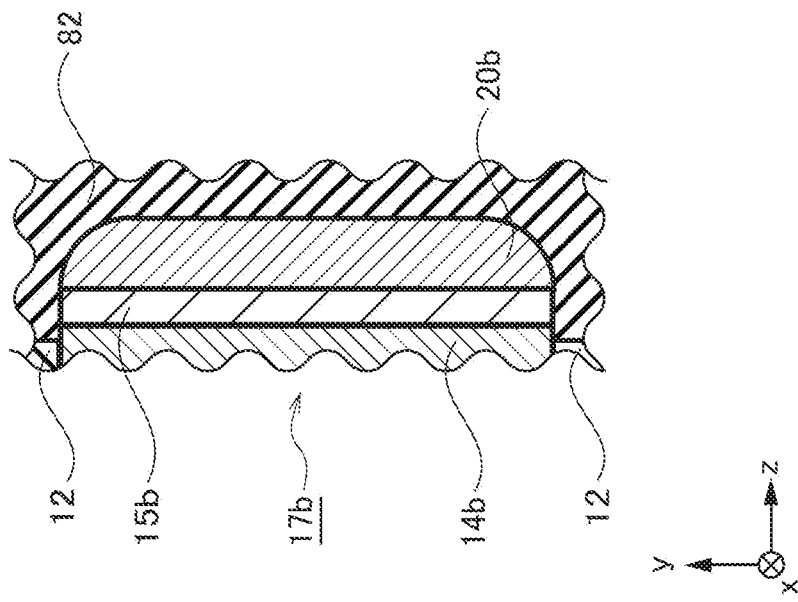
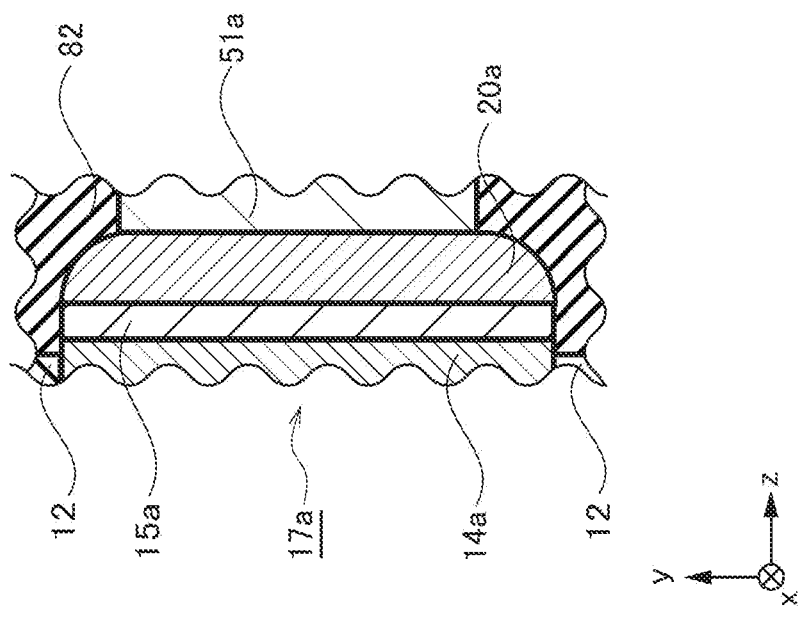

SEMICONDUCTOR DEVICE

CROSS-REFERENCE TO RELATED APPLICATION

This application is based upon and claims the benefit of priority from Japanese Patent Application No. 2022-044781, filed on Mar. 21, 2022, the entire contents of which are incorporated herein by reference.

FIELD

Embodiments described herein relate generally to semiconductor device.

BACKGROUND

A semiconductor device having a semiconductor chip such as a metal oxide semiconductor field effect transistor (MOSFET) is used for applications such as power conversion. For example, when semiconductor device described above is a vertical MOSFET, a source electrode provided on an upper surface of a semiconductor chip is connected to a connector provided on MOSFET, for example.

BRIEF DESCRIPTION OF THE DRAWINGS

FIG. 2 is a schematic cross-sectional view of a main part of the semiconductor device of the first embodiment.

FIG. 3A-B are schematic diagrams of a cross section taken along a line A-A' in FIG. 1.

DETAILED DESCRIPTION

Figure 1:
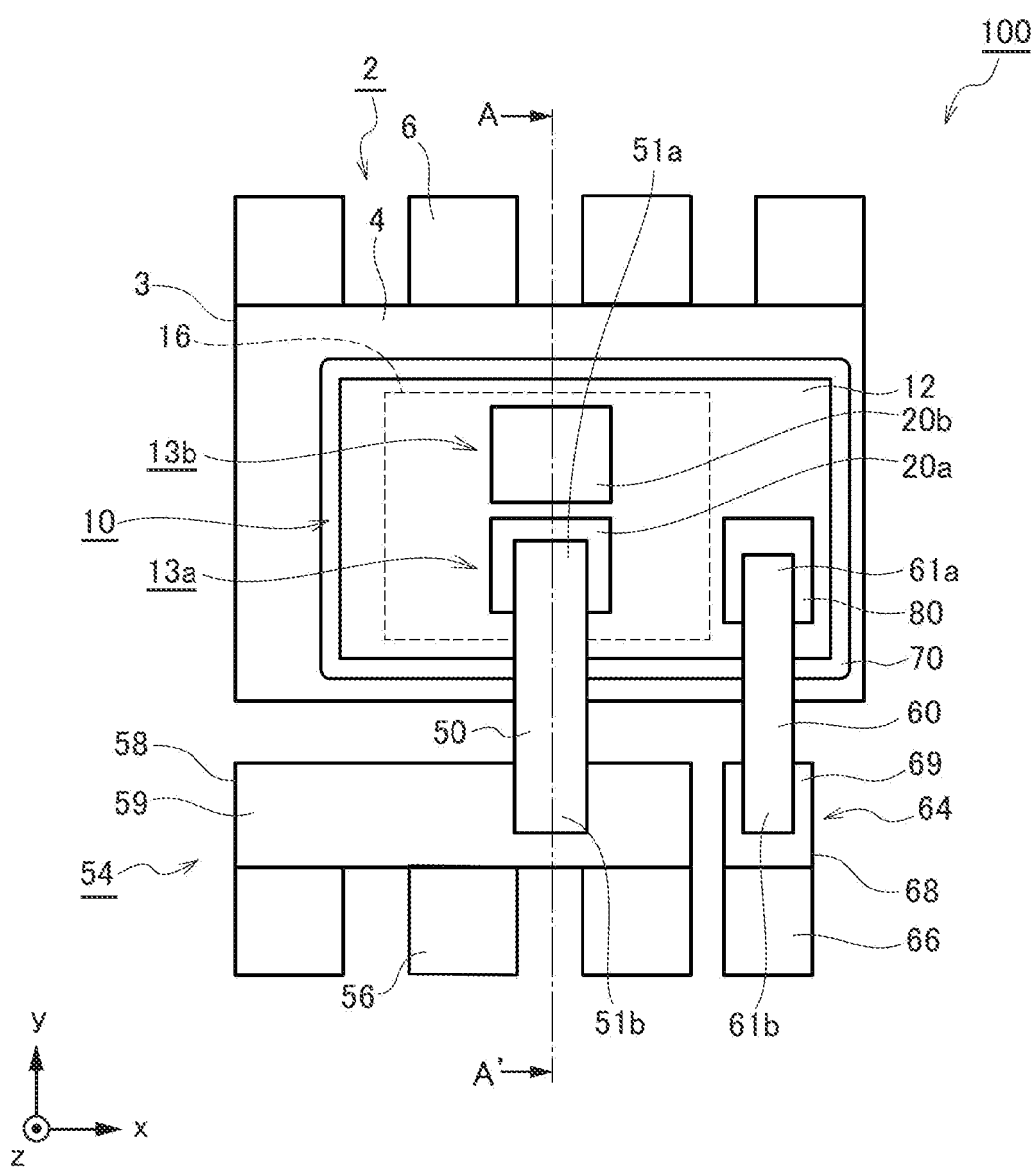
FIG. 1 is a schematic top view of a semiconductor device of a first embodiment.

Hereinafter, embodiments of the present disclosure will be described with reference to the drawings. Note that in the following description, the same members and the like are denoted by the same reference numerals, and description of members and the like once described is appropriately omitted.

In this specification, in order to illustrate the positional relationship of parts and the like, the upward direction of the drawings may be referred to as "upper", and the downward direction of the drawings may be referred to as "lower". Here, the terms "up" and "down" do not necessarily indicate a relationship with the direction of gravity.

Hereinafter, a case where a first conductivity type is n-type and a second conductivity type is p-type will be exemplified.

In the following description, notations of $n^+$, n, $n^-$, $p^+$, p, and $p^-$ indicate a relative level of an impurity concentration of each of the conductivity types. That is, $n^+$ indicates that an impurity concentration of n-type is relatively higher than n, and $n^-$ indicates that the impurity concentration of n-type is relatively lower than n. $p^+$ indicates that an impurity concentration of p-type is relatively higher than p, and $p^-$ indicates that the impurity concentration of p-type is relatively lower than p. Note that $n^+$ type and $n^-$ type may be simply referred to as n type, and $p^+$ type and $p^-$ type may be simply referred to as p type.

First Embodiment

The semiconductor device of the present embodiment includes a lead frame; a first bonding material provided on the lead frame; a semiconductor chip provided on the first bonding material, the semiconductor chip including a lower surface, an upper surface, a first electrode provided on the lower surface, the first electrode being connected to the first bonding material, a second electrode provided on the upper surface, and a plurality of electrode pads connected to the second electrode; a plurality of second bonding materials, each of the second bonding materials being provided on each of the electrode pads; and a first connector connected to at least one of the second bonding materials, wherein the second bonding material which is not connected to the first connector is not connected to a connector or a wire. The semiconductor device of the present embodiment includes a lead frame (2); a first bonding material (70) provided on the lead frame (2); a semiconductor chip (10) provided on the first bonding material (70), the semiconductor chip (10) including a lower surface (10a), an upper surface (10b), a first electrode (11) provided on the lower surface (10a), the first electrode (11) being connected to the first bonding material (70), a second electrode (16) provided on the upper surface (10b), and a plurality of first electrode pads (17) connected to the second electrode (16); a plurality of second bonding materials (20), each of the second bonding materials (20) being provided on each of the first electrode pads (17); and a first connector (50), wherein the second bonding materials (20) includes at least one third bonding material (20a) which is joined (bonded) to the first connector (50) and a fourth bonding material (20b) which is not connected to the first connector (50) or a wire (62), and wherein the first electrode pads (17) include at least one second electrode pad (17a) provided below the third bonding material (20a) and a third electrode pad (17b) provided below the fourth bonding material (20b).

The semiconductor device of the present embodiment includes a lead frame; a first bonding material provided on the lead frame; a semiconductor chin provided on the first bonding material, the semiconductor chip including a lower surface, an upper surface, a first electrode provided on the lower surface, the first electrode being connected to the first bonding material, a second electrode provided on the upper surface, and a plurality of electrode pads connected to the second electrode; a plurality of second bonding materials, each of the second bonding materials being provided on each of the electrode pads; a first connector connected to at least one of the second bonding materials; and a sealing resin provided on the second bonding material not being connected to the first connector. The semiconductor device of the present embodiment includes a lead frame (2); a first bonding material (70) provided on the lead frame (2); a semiconductor chip (10) provided on the first bonding material (70), the semiconductor chip (10) including a lower surface (10*a*), an upper surface (10*b*), a first electrode (11) provided on the lower surface (10*a*), the first electrode (11) being connected to the first bonding material (70), a second electrode (16) provided on the upper surface (10*b*), and a plurality of first electrode pads (17) connected to the second electrode (16); a plurality of second bonding materials (20), each of the second bonding materials (20) being provided on each of the first electrode pads (17); a first connector (50) connected to at least one of the second bonding materials (20); and a sealing resin (82), wherein the second bonding materials (20) further include a fourth bonding material (20*b*) which is not connected to the first connector (50), and wherein the sealing resin (82) is provided on the fourth bonding material (82).

FIG. 1 is a schematic top view of the semiconductor device 100 of the present embodiment. FIG. 2 is a schematic cross-sectional view of a main part of the semiconductor device 100 of the present embodiment. FIG. 2 is a schematic diagram of a cross section taken along line A-A' in FIG. 1. FIG. 3A-B are schematic diagrams of a cross section taken along line A-A' in FIG. 1. FIG. 3A is a schematic view of a A-A' cross-section in the vicinity of a second bonding material 20*a*. FIG. 3B is a schematic view of a A-A' cross-section in the vicinity of the second bonding material 20*b*. In FIG. 3A and FIG. 3B, a sealing resin 82 is also shown. In FIG. 1 and FIG. 2, the sealing resin 82 is not illustrated.

The semiconductor device 100 of the present embodiment will be described using FIG. 1, FIG. 2 and FIG. 3A-B.

A lead frame 2 is a member on which a semiconductor chip 10 is disposed and includes a conductive material such as Cu (copper). The lead frame 2 includes a first bed 3 and a first outer lead 6. The first bed 3 includes a first bed surface 4. The semiconductor chip 10 is provided on the first bed surface 4. The first outer lead 6 is connected to the first bed 3. The first outer lead 6 is used to connect the semiconductor chip 10 and an external circuit (not shown).

A first bonding material 70 is provided between the first bed surface 4 of the lead frame 2 and the semiconductor chip 10. The first bonding material 70 is provided on the first bed surface 4 of the lead frame 2. The first bonding material 70 joins a drain electrode (an example of a first electrode) 11 of the semiconductor chip 10 and the first bed surface 4. For example, if the semiconductor chip 10 is provided with a MOSFET, the first bonding material 70 connects the drain electrode 11 of the semiconductor chip 10 and the first bed surface 4.

The semiconductor chip 10 is provided on the first bonding material 70. The semiconductor chip 10 has a lower surface 10*a*, and an upper surface 10*b*. Further, the semiconductor chip 10 includes the drain electrode 11 provided on the lower surface 10*a*, a source electrode (an example of a second electrode) 16 provided on the upper surface 10*b*, a plurality of electrode pads 17 provided on the source electrode 16, and a third insulating film 12 provided on the source electrode 16. The semiconductor chip 10 is, for example, a chip in which the vertical MOSFET or an IGBT (Insulated Gate Bipolar Transistor) or the like is provided on a semiconductor substrate such as an Si (silicon) substrate, an SiC (silicon carbide) substrate, a GaAs (gallium arsenide) substrate, or a GaN (gallium nitride) substrate.

Here, an X-direction, a Y-direction vertically intersecting with the X-direction, and a Z-direction vertically intersecting with the X-direction and the Y-direction are defined. It is assumed that the first bed surface 4, the lower surface 10*a* and the upper surface 10*b* are provided parallel to the XY plane.

For example, if the semiconductor chip 10 is provided with a MOSFET, the source electrode 16 corresponds to a source electrode of such a MOSFET. The source electrode 16 includes, for example, Al (aluminum).

The third insulating film 12 is provided on the source electrode 16 of the semiconductor chip 10. The third insulating film 12 is provided, for example, on an end of the semiconductor chip 10 and on an end of the source electrode 16. The third insulating film 12 has an opening 13*a* and an opening 13*b* on the source electrode 16. The opening 13*a* and the opening 13*b* pass through the third insulating film 12. The third insulating film 12 includes, for example, an insulating material such as polyimide. Note that the number of the openings 13 is not limited to those shown in this embodiment.

The plurality of electrode pads 17 are provided in the opening 13 on the source electrode 16. The plurality of electrode pads 17 are connected to the source electrode 16. An electrode pad 17*a* is provided on the source electrode 16 in the opening 13*a*. An electrode pad 17*b* is provided on the source electrode 16 in the opening 13*b*. Note that the number of electrode pads 17 is not limited to those shown in this embodiment. The electrode pad 17 includes, for example, a first layer 14 including Ni (nickel) and a second layer 15 provided on the first layer 14 and including Au (gold). The configuration of the electrode pad 17 is not limited to that described above. For example, the electrode pad 17 may include an alloy of Ni and Au. For example, the electrode pad 17 may include a layer containing Ni, a layer containing Pd (palladium) provided on the layer containing Ni, and a layer containing Au provided on the layer containing Pd. Further, the electrode pad 17 may contain Cu, for example. Further, the electrode pad 17 may have, for example, layers including Cu. The electrode pad 17 is provided, for example, to increase the bonding strength between the source electrode 16 and the second bonding material 20.

A plurality of second bonding materials 20 are provided on each of the electrode pads 17. A second bonding material 20*a* is provided on the electrode pad 17*a*. A second bonding material 20*b* is provided on the electrode pad 17*b*. The second bonding material 20 may be referred to as a metal layer.

A first connector 50 includes a first end 51*a* and a second end 51*b*. The first connector 50 includes, for example, a conductive material such as Cu. Incidentally, the surface of the first connector 50 may be plated by a material containing, for example, Tin (Sn). The first end 5l*a* is provided on the second bonding material 20*a* in the opening 13 and is connected to the second bonding material 20*a*. Thus, the first connector 50 is electrically connected to the electrode pad 17*a* via the second bonding material 20*a*. On the other hand, the first connector 50 is not connected to the second bonding material 20*b*. The first connector 50 is not connected to the electrode pad 17*b* via the second bonding material 20*b*. The second end 51*b* is provided on the second bed 58 and is connected to the second bed 58 using a third bonding material 59. The first connector 50 is provided to extend in the Y-direction and straddles between the first post 54 and the lead frame 2. Incidentally, even when the electrode pad 17a and the second bed 58 are connected using a wire instead of the first connector 50, such wire is not connected to the second bonding material 20b. Further, such wire is not connected to the electrode pad 17a via the second bonding material 20b.

The sealing resin 82 is provided on the third insulating film 12 and the second bonding material 20 so as to cover at least the third insulating film 12, the electrode pad 17, and the second bonding material 20. Here, as shown in FIG. 3A, around the second bonding material 20a, the sealing resin 82 is provided so as to cover around the second bonding material 20a and around the first end 51a of the first connector 50. On the other hand, as shown in FIG. 3B, around the second bonding material 20b, the sealing resin 82 is provided so as to cover the second bonding material 20b. In this instance, the entire upper surface of the second bonding material 20b is in direct contact with the sealing resin 82. The sealing resin 82 includes, for example, a resin such as an epoxy resin. Further, the sealing resin 82 may include a filler such as silica or alumina.

The first post 54 includes a second bed 58 and a second outer lead 56. The first post 54 includes a conductive material such as Cu. The second outer lead 56 is used for connecting the semriconductor chip 10 and an external circuit (not shown).

A second post 64 includes a second bed 68 and a third outer lead 66. The second post 64 includes a conductive material such as Cu. The third outer lead 66 is used for connecting the semiconductor chip 10 and an external circuit (not shown).

A third bonding material 59 is provided between the second bed 58 and the second end 51b. The third bonding material 59 connects the second bed 58 and the second end 51.

A third connector 60 has a third end 61a and a fourth end 61b. The third connector 60 includes, for example, a conductive material such as Cu. Incidentally, the surface of the third connector 60 may be plated by a material containing, for example, Sn. The third end 61a is electrically connected to the semiconductor chip 10 via a fourth bonding material 80 provided on the semiconductor chip 10. The fourth bonding material 80, for example, is electrically connected to the gate electrode of MOSFET.

Incidentally, the first connector 50 and the third connector 60 can not be easily bent and are hard connectors, which are different from wires used for bonding.

A fifth bonding material 69 is provided between the second bed 68 and the fourth end 61b. The fifth bonding material 69 connects the second bed 68 and the fourth end 61b.

Figure 4:
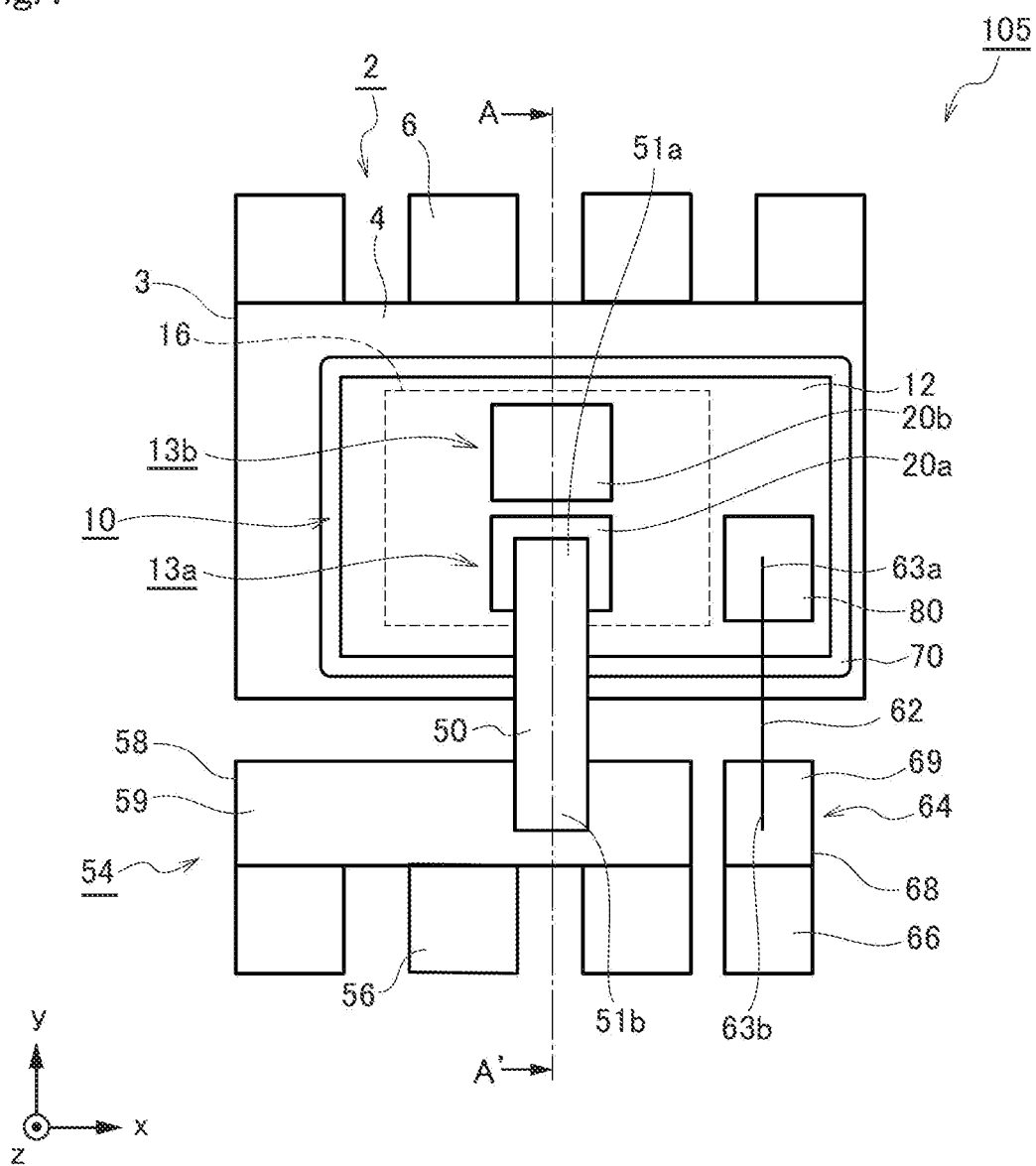
FIG. 4 is a schematic top view of a semiconductor device according to another aspect of the first embodiment.

FIG. 4 is a schematic top view of a semiconductor device 105 according to another aspect of the present embodiment. Instead of the third connector 60, a wire 62 is used. Instead of the third connector 60, the wire 62 may be used. An end 63a of the wire 62 is connected to the fourth bonding material 80. An end 63b of the wire 62 is connected to the fifth bonding material 69.

As the first bonding material 70, the second bonding material 20, the third bonding material 59, the fourth bonding material 80, and the fifth bonding material 69, for example, solder containing Pb (lead) and Sn (tin), solder containing Pb, Ag (silver), and Sn (tin), solder containing Sn and Sb (antimony), solder containing Au (gold) and Sn, solder containing Au and Si, or solder containing Au and Ge (germanium), Ag paste, ultrasonic solder, or the like can be preferably used.

Next, the operation and effects of semiconductor device of the present embodiment will be described.

Figure 5:
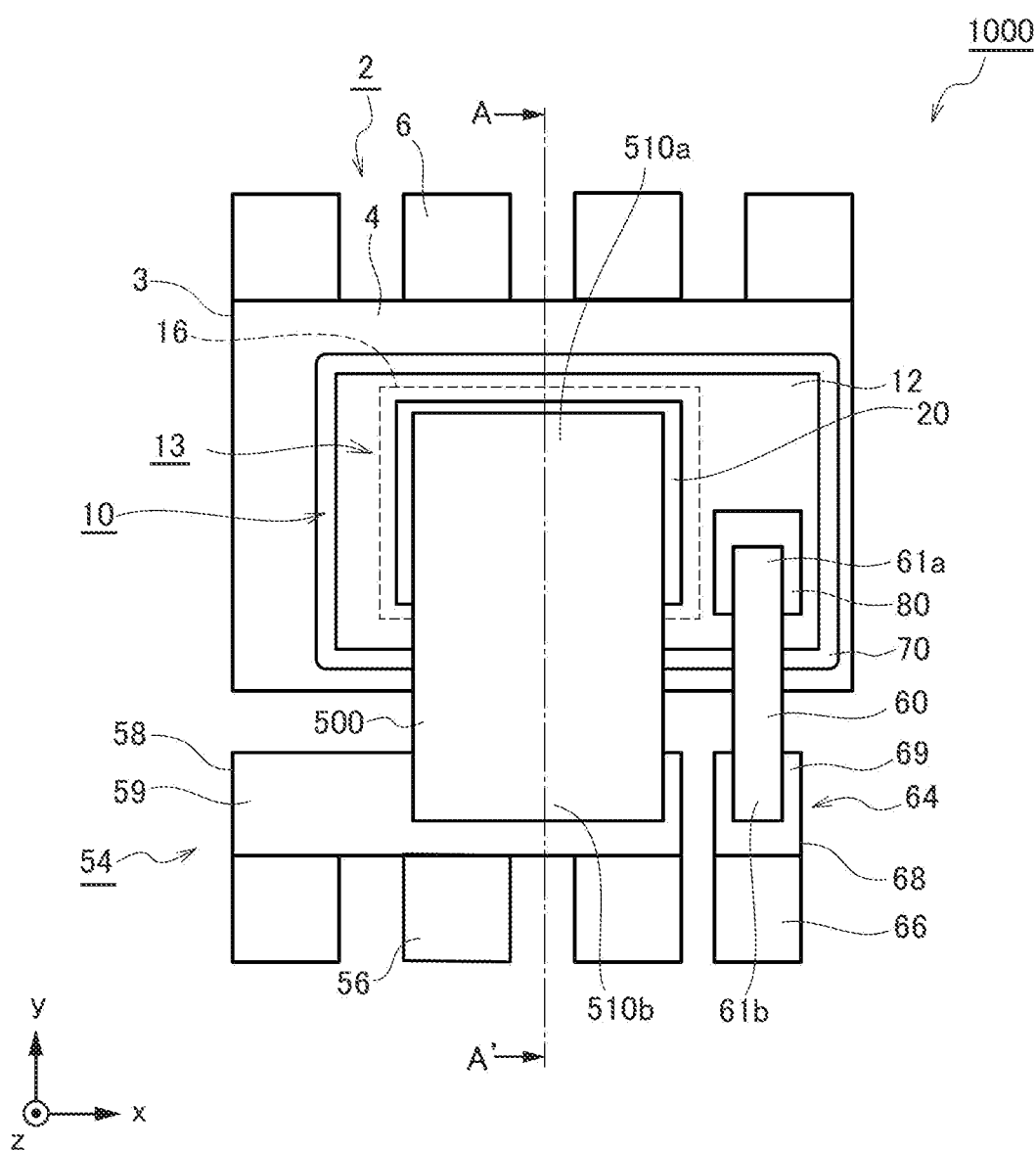
FIG. 5 is a schematic top view of a semiconductor device as a first comparative embodiment of the first embodiment.

FIG. 5 is a schematic top view of a semiconductor device 1000 as a first comparative embodiment of the present embodiment. The number of openings 13 and the number of second bonding material 20 are one. Then, the number of electrode pads 17 (not shown) in FIG. 5 is also one. Further, the area of the opening 13 in the XY-plane, the area of the second bonding material 20 in the XY-plane and the area of the electrode pad 17 in the XY-plane, respectively, are larger than those in the semiconductor device 100.

The semiconductor chip 10 itself tends to warp due to internal stress of the semiconductor chip, for example, when the Z-direction is facing up. On the other hand, particularly when Ni is included in the electrode pad 17, due to the tensile stresses of Ni, so as to cancel the internal stress of the semiconductor chip, it was possible to suppress the warpage of the semiconductor chip and a wafer. In this way, carrying trouble of the semiconductor chip and the wafer is prevented. Incidentally, for example, even when Cu is included in the electrode pad 17, similarly, it was possible to prevent the carrying trouble of the semiconductor chin and the wafer.

In order to reduce the on-resistance of the semiconductor device as much as possible, the semiconductor device 1000 uses a connector 500 having a larger volume than the connector 50 used in the semiconductor device 100. The connector 500 includes an end 510a connected to the second bonding material 20 and an end 510b connected to the third bonding material 59.

Figure 6:
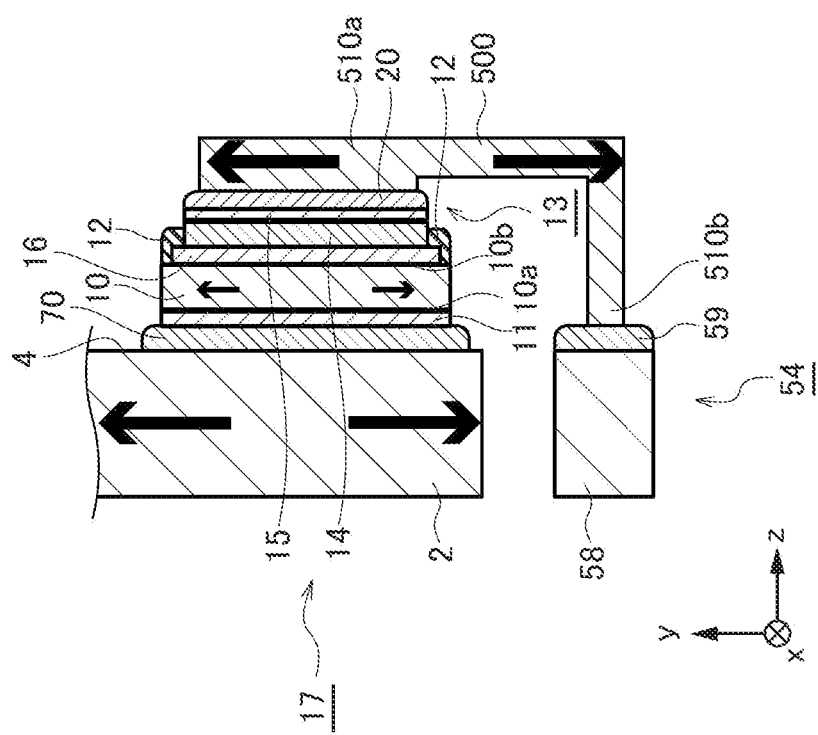
FIG. 6 is a schematic diagram of a cross section taken along a line A-A' in FIG. 5.

FIG. 6 is a schematic view of a cross section A-A' of the first comparative embodiment of the semiconductor device 1000 of the present embodiment. Arrows shown in the lead frame 2, the semiconductor chip 10, and the connector 500 schematically show a thermal expansion when the semiconductor device 1000 is heated by reliability assessment such as temperature cycling test.

Generally, as compared with the thermal expansion coefficient of the semiconductor material such as Si used in semiconductor chip 10, the thermal expansion coefficient of Cu or the like used in the lead frame 2 and the connector 500 is large. Therefore, due to the temperature rise of the semiconductor device 1000, the semiconductor chip 10 is stretched strongly in the XY plane. Therefore, by the reliability assessment such as thermal cycling test, the semiconductor chip 10 cracks, and it was sometimes impossible to achieve high reliability.

Figure 7:
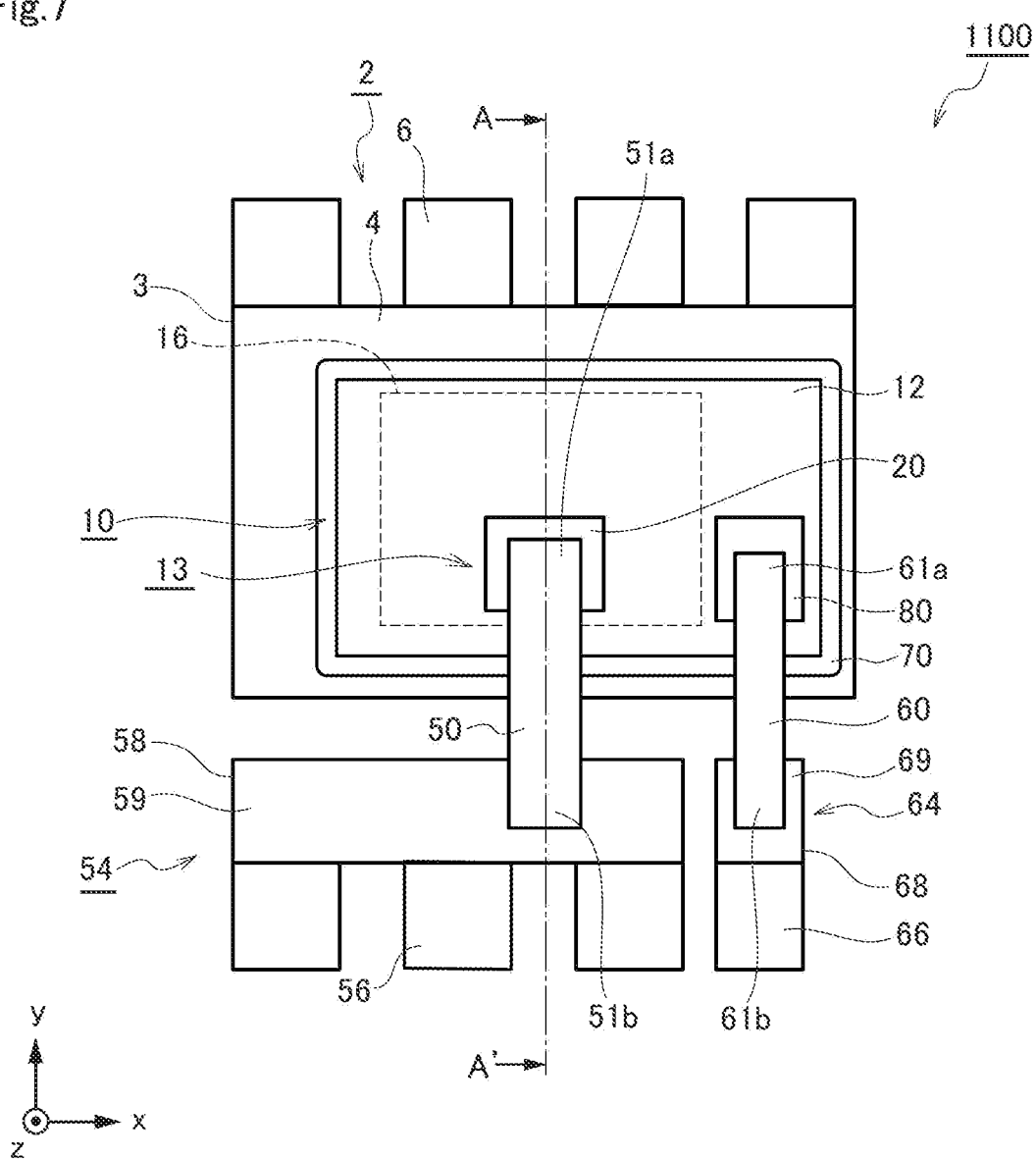
FIG. 7 is a schematic top view of a semiconductor device as a second comparative embodiment of the first embodiment.

FIG. 7 is a schematic top view of a semiconductor device 1100 as a second comparative embodiment of the present embodiment. The number of openings 13 and the number of second bonding materials 20 are one. Then, the number of electrode pads 17 (not shown) in FIG. 7 is also one. Further, the area of the opening 13 in the XY-plane, the area of the second bonding material 20 in the XY-plane, and the area of the electrode pad 17 in the XY-plane, respectively, are smaller than that of the semiconductor device 1100.

To achieve high reliability, the volume of the connector 50 is reduced to less than the volume of the connector 500 of the semiconductor device 1100 shown in FIG. 5 and FIG. 6. Thus, at the time of temperature rise of the semiconductor chip 10, it is suppressed that the semiconductor chip 10 is stretched strongly in the XY-plane. However, in such cases, with the use of the connector 50 having a small volume, the area of electrode pad 17 has become smaller. Therefore, the tensile stresses of the above electrode pad 17 is reduced, it was sometimes impossible to suppress warpage of the semiconductor chip and the wafer. Therefore, the semiconductor chip and the wafer may not be transported in some cases.

Therefore, the semiconductor device 100 of the present embodiment includes the first connector 50 which is electrically connected to at least one of the plurality of electrode pads 17.

Figure 8:
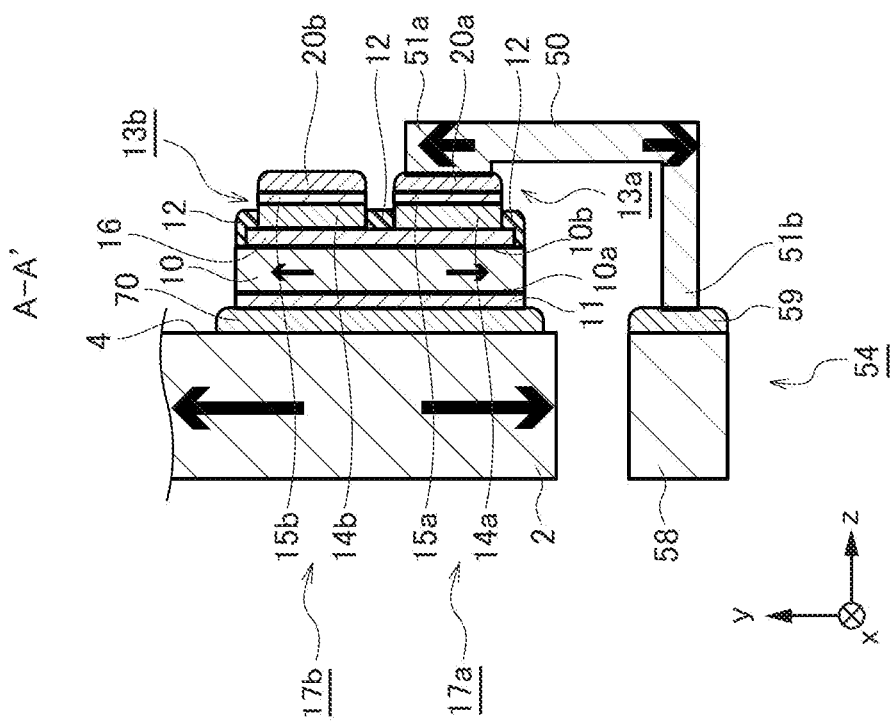
FIG. 8 is a schematic diagram showing the operation and effects of the semiconductor device of the first embodiment.

FIG. 8 is a schematic diagram showing the operation and effects of the semiconductor device 100 of the present embodiment. Arrows shown in the lead frame 2, the semiconductor chip 10 and the connector 50 schematically show thermal expansion due to temperature rise of the semiconductor device 100.

The reduced volume of the first connector 50 reduces the thermal expansion of the first connector 50. Therefore, cracks in the semiconductor chip 10 are less likely to occur. Furthermore, by providing the second bonding material 20b which is not connected to the first connector 50 or the wire, warpage due to internal stress in the semiconductor chip or the wafer state can be canceled out by the tensile stresses of the electrode pad 17b provided below the second bonding material 20b. Therefore, it is possible to suppress warpage of semiconductor chip and the wafer state. This can prevent the carrying trouble of the semiconductor chip and the wafer. Therefore, it is possible to provide a semiconductor device 100 with improved reliability.

The second bonding material 20b which is not electrically connected to the first connector 50 is covered with the sealing resin 82. Or, the second bonding material 20b which is not electrically connected to the first connector 50 is not connected to the connector or the wire.

According to the semiconductor device 100 of the present embodiment, the semiconductor device 100 with improved reliability can be provided.

Second Embodiment

The semiconductor device of the present embodiment is different from the semiconductor device of the first embodiment in that the semiconductor device of the present embodiment further includes a first semiconductor layer of first conductivity type provided on the first electrode, a first semiconductor region of second conductivity type provided on the first semiconductor layer, a second semiconductor region of first conductivity type provided on the first semiconductor region, the second electrode provided on the second semiconductor region, the second electrode being electrically connected to the second semiconductor region, and a third electrode provided in a first trench, the first trench reaching the first semiconductor layer from above the first semiconductor region, the third electrode facing the first semiconductor layer via a first insulating film, wherein the first trench extends in a first direction parallel to the upper surface, and wherein the electrode pad which is provided above the first trench and which is not connected to the first connector via the second bonding material extends in a second direction, the second direction is parallel to the upper surface and intersects the first direction. The semiconductor device of the present embodiment is different from the semiconductor device of the first embodiment in that the semiconductor device of the present embodiment further includes a first semiconductor layer (112) of first conductivity type provided on the first electrode (11), a first semiconductor region (114) of second conductivity type provided on the first semiconductor layer (112), a second semiconductor region (116) of first conductivity type pro-vided on the first semiconductor region (114), and a third electrode (128) provided in a first trench (119), the first trench (119) reaching the first semiconductor layer (112) from above the first semiconductor region (114), the thil29second rd electrode (123) facing the first semiconductor layer (112) via a first insulating film (112), wherein the second electrode (16) is provided on the second semiconductor region (116) and is electrically connected to the second semiconductor region (116), wherein the first trench (119) extends in a first direction (Y-direction) parallel to the upper surface (10b), and wherein the third electrode pad (17b) is provided above the first trench (119) and extends in a second direction (X-direction) parallel to upper surface (10b) and intersecting the first direction (Y-direction). Here, description of the same content as that of semiconductor device of the first embodiment is omitted.

Figure 9:
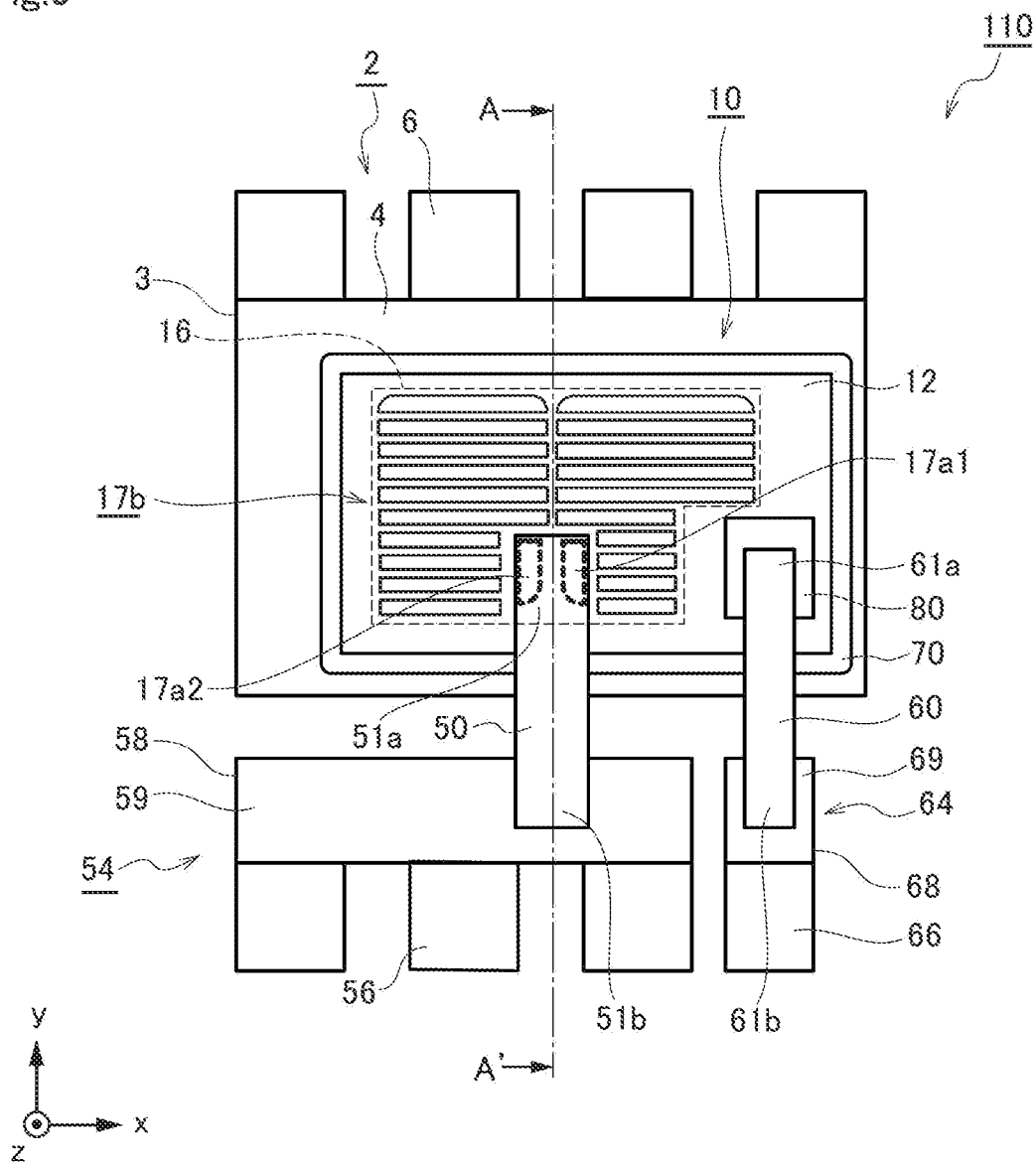
FIG. 9 is a schematic top view of a semiconductor device of the second embodiment.

FIG. 9 is a schematic top view of a semiconductor device 110 of the present embodiment.

In FIG. 9, the second bonding material 20 is not shown, and the electrode pad 17 provided below the second bonding material 20 is shown. The same shall apply to FIG. 10 and subsequent figures.

The first end 51a of the first connector 50 is connected to the electrode pad 17a, and the electrode pad $17a_2$ via the second bonding material 20. Further, the second bonding material $20a_1$ and the second bonding material $20a_2$ are provided on the electrode pad $17a_1$ and the electrode pad $17a_2$. The first end 51a may be connected to one electrode pad.

Further, in the semiconductor device 110, a plurality of electrode pads 17b is provided. Each electrode pad 17b extends in the X-direction.

Figure 10:
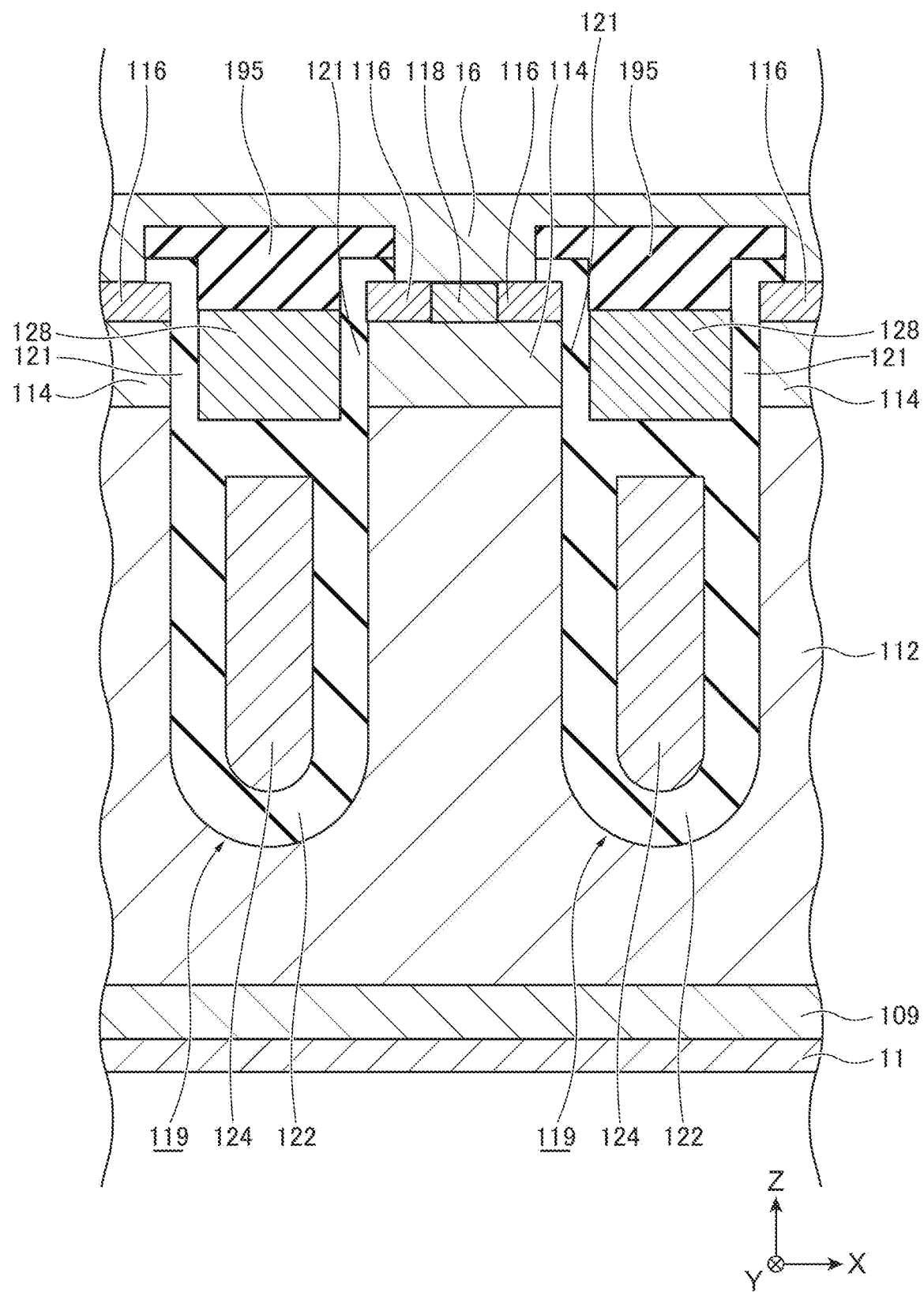
FIG. 10 is a schematic cross-sectional view of a main part of the semiconductor device of the second embodiment.

FIG. 10 is a schematic cross-sectional view of a main part of a semiconductor device 110 of the present embodiment. Trench-type MOSFET is provided in the semiconductor chip 10 of semiconductor device 110. Incidentally, in the semiconductor chip 10, for example, trench-type IGBT may be provided.

The drain electrode 11 functions as MOSFET's drain electrode.

A drain layer 109 is provided on the drain electrode 11. The drain layer 109 includes, for example, a $n^+$ type semiconductor material.

A drift layer (an example of a first semiconductor layer) 112 is provided on the drain layer 109. The drift layer 112 functions as a drift layer of the MOSFET. The drift layer 112 includes, for example, an $n^-$ type semiconductor material.

A base region (an example of a first semiconductor region) 114 is provided on the drift layer 112. The base region 114 functions as a base of the MOSFET. The base region 114 is a region that forms a channel when a voltage is applied to the gate electrode 128 to be described later, allowing carriers to flow between the drain layer 109 and source region 116 to be described later. The base region 114 contains, for example, a p-type semiconductor material.

A source region (an example of a second semiconductor region) 116 is provided on the base region 114. The source region 116 functions as a source of the MOSFET. Carriers flow between the source region 116 and the drain layer 109 when appropriate voltage is applied to the gate electrode 128, which will be described later. The source region 116 includes, for example, a $n^+$ type semiconductor material.

The contact region 118 is provided on the base region 114 and is electrically connected to the base region 114 and the source region 116. The contact region 118 is provided in order to improve electrical contact of the base region 114 and the source region 116 with the source electrode 16. The contact region 118 includes, for example, a p+ type semiconductor material.

A trench 119 is provided to reach the drift layer 112 from above the base region 114 and the source region 116. The trench 119 extends in the back direction of the figure (Y-direction, which is an example of a first direction). In other words, the trench 119 extends in the Y direction perpendicular to the direction in which electrode pad 17b extends (X-direction, an example of a second direction).

A first insulating film 122 is provided in the trench 119. For example, the first insulating film 122 is provided so as to cover a field plate electrode 124, which will be described later. The first insulating film 122 is a field plate insulating film. For example, the first insulating film 122 is provided between the field plate electrode 124 and the gate electrode 128. However, the form of the first insulating film 122 is not limited to this form. The first insulating film 122 includes, but is not limited to, $SiO_x$ (silicon oxide).

A fifth insulating film. 121 is provided, in the trench 119, between the base region 114 and the gate electrode 128 on the first insulating film 122 and between the interlayer insulating film 195 which will be described later and the source region 116 on the first insulating film 122. The fifth insulating film 121 is a gate insulating film. The fifth insulating film 121 includes, but is not limited to, $SiO_x$ (silicon oxide).

The field plate electrode (an example of a third electrode) 124 is provided in the trench 119 so as to face the drift layer 112 via the first insulating film 122. For example, the field plate electrode 124 is provided side by side with the drift layer 112. Like the trench 119, the field plate electrode 124 extends in the Y-direction. The field plate electrode 124, for example, is provided to assist extending the depletion layer from the base region 114 to the drift layer 112, and to increase the breakdown voltage.

The gate electrode 128 is provided above the field plate electrode 124. The gate electrode 128 is provided between the plurality of base regions 114 via the fifth insulating films 121. The gate electrode 128 extends in the Y-direction. The gate electrode 128 is an electrode that serves as a gate for MOSFET.

The interlayer insulating film 195 is provided above the source region 116, on the gate electrode 128, and on the fifth insulating film 121. The interlayer insulating film 195 includes, for example, but is not limited to, $SiO_x$.

The source electrode 16 is provided on the source region 116 and the contact region 118, and is electrically connected to the source region 116 and the contact region 118. The electrode pads 17 (not shown in FIG. 10) are appropriately provided on the source electrode 16.

Figure 11:
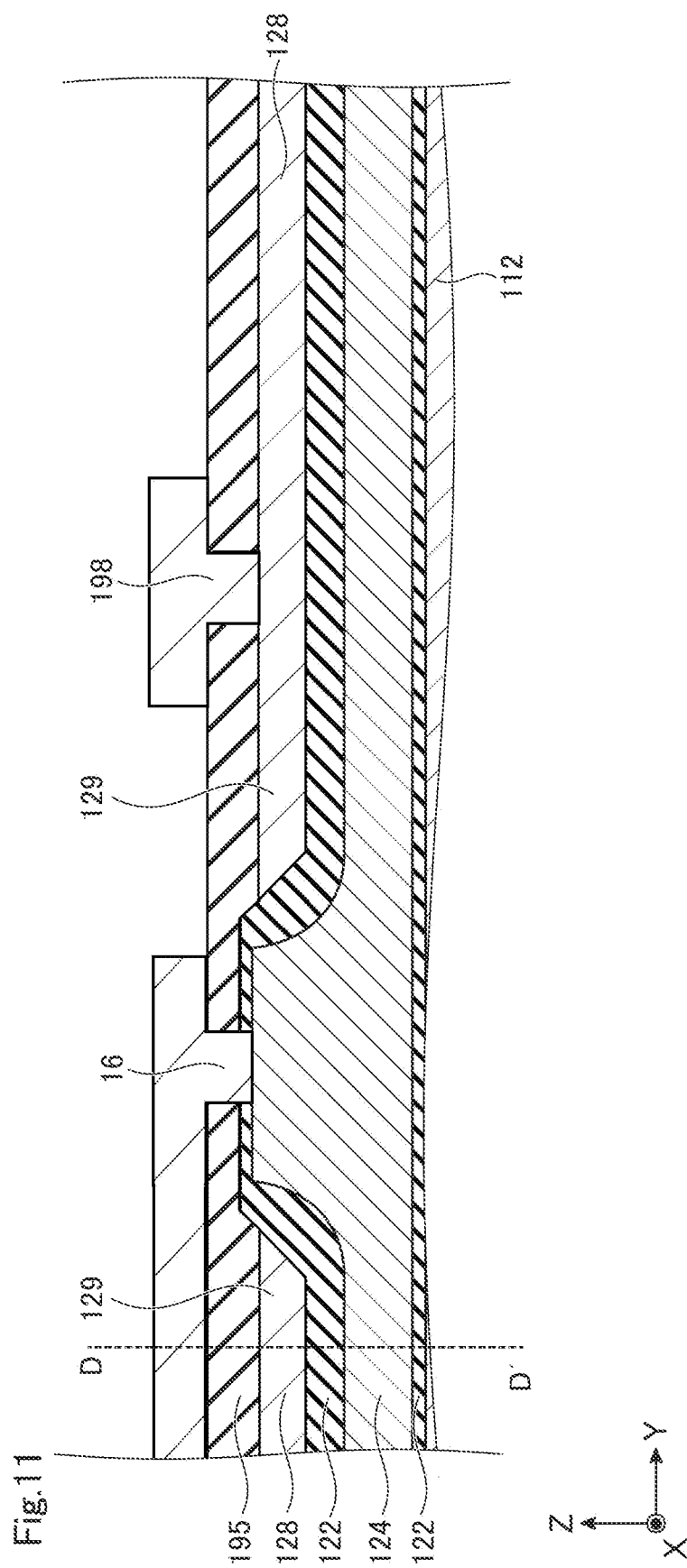
FIG. 11 is a schematic cross-sectional view of a main part of the semiconductor device of the second embodiment.

FIG. 11 is a schematic cross-sectional view of a main part of semiconductor device 110 of the present embodiment. FIG. 11 is a schematic cross-sectional view for showing an example of a connection method of the field plate electrode 124 and the source electrode 16 and an example of a connection method of the gate electrode 128 and the gate metal 198. For example, a schematic cross-sectional view of FIG. 10 corresponds to a schematic cross-sectional view in a D-D' cross-section of FIG. 11.

The field plate electrode 124 has a portion extending in the Z-direction. The field plate electrode 124 is electrically connected to the source electrode 16 through a contact hole formed in the interlayer insulating film 195 by using the portion extending in the Z-direction.

The gate electrode 128 is electrically connected to the gate metal 198 through a contact hole provided in the interlayer insulating film 195. For example, the gate metal 198 is provided below the fourth bonding material 80 (FIG. 1) and is electrically connected to the fourth bonding material 80.

Note that the portion 129 of gate electrode 128 extending in the Y-direction may be provided, for example, below between the electrode pad 17a, and the electrode pad $17a_2$ (FIG. 9). In such cases, the portion 129 of the gate electrode 128 extending in the Y-direction is an example of a conductive line, or a connection wiring connected to the gate electrode 128. The plurality of second bonding materials (20) includes the plurality of third bonding materials (20a) joined to the first connector (50), and the semiconductor device further includes a connection wiring (129) connected to the third electrode (128) and provided below between the third bonding materials (20a).

Next, the operation and effects of semiconductor device of the present embodiment will be described.

The semiconductor chip 10 having the trench. 19 has a higher internal stress and tends to warp in a plane perpendicular to the direction in which trench 119 extends. For example, as in semiconductor device 110, when the trench 119 is extended in the Y-direction, the internal stress is higher in the XZ-plane than in the YZ-plane, and the semiconductor chip 10 tends to warp.

Therefore, in the semiconductor device 110, electrode pad 17 is provided so as to extend in the X-direction. Thus, the warpage of the semiconductor chip 10 in the XZ plane can be suppressed better.

The semiconductor device 110 of the present embodiment can also provide the semiconductor device with improved reliability.

Third Embodiment

The semiconductor device of the present embodiment is different from the semiconductor device of the first and second embodiments in that the semiconductor device of the present embodiment further includes a fourth electrode provided in a second trench, the second trench reaching the first semiconductor layer from above the first semiconductor region, the fourth electrode facing the first semiconductor layer via a second insulating film, wherein the second trench extends in a third direction parallel to the upper surface and intersecting the first direction, and wherein the electrode pad which is provided above the second trench and which is not connected to the first connector via the second bonding material extends in a fourth direction, the fourth direction is parallel to the upper surface and intersects the third direction. The semiconductor device of the present embodiment is different from the semiconductor device of the first and second embodiments in that the semiconductor device of the present embodiment further includes a fourth electrode (128) provided in a second trench (119), the second trench (119) reaching the first semiconductor layer (112) from above the first semiconductor region (114), the fourth electrode (128) facing the first semiconductor layer (112) via a second insulating film (122), wherein the second trench (119) extends in a third direction (X-direction) parallel to the upper surface (10b) and intersecting the first direction (Y-direction), and wherein the first electrode pad (17c) provided above the second trench (129) and not electrically connected to the first connector (50) via the second bonding material (20) extend in a fourth direction (Y-direction), the fourth direction (Y-direction) is parallel to the upper surface (10b)

and intersects the third direction (X-direction). Here, description of contents overlapping with the first and second embodiments is omitted.

Figure 12:
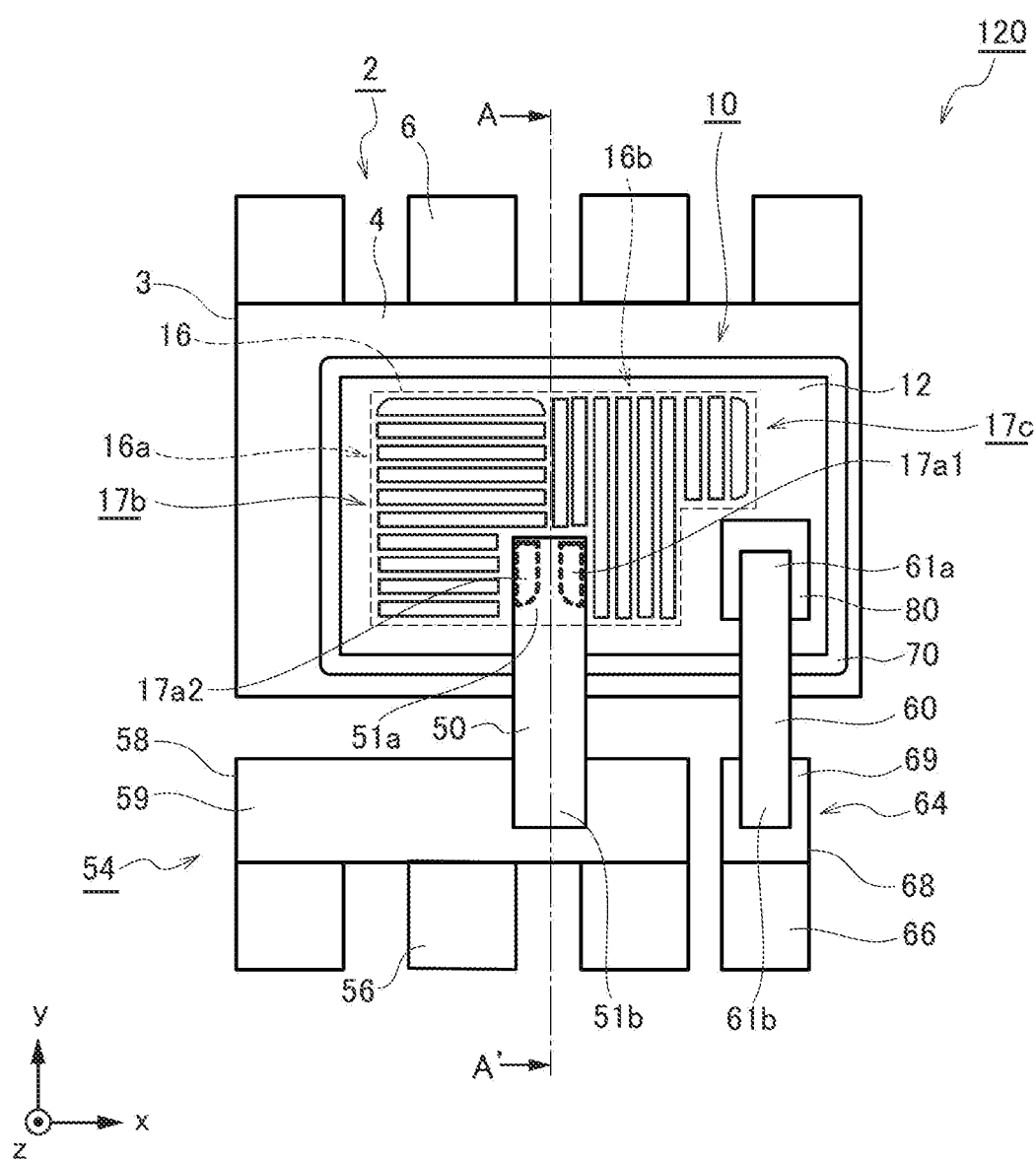
FIG. 12 is a schematic top view of a semiconductor device of the third embodiment.

FIG. 12 is a schematic top view of a semiconductor device 120 of the present embodiment.

In a first region 16a on the source electrode 16, the electrode pads 17b extend in the X-direction (an example of a second direction). The trench 119 (an example of a first trench) below the electrode pads 17b, the first insulating film 122 (an example of a second insulating film) below the electrode pads 17b, and the field plate electrode 124 below the electrode pads 17b extend in the Y-direction (an example of a first direction).

In a second region 16b on the source electrode 16, the electrode pads 17c extend in the Y-direction (an example of a fourth direction). The trench 119 (an example of a second trench) below the electrode pads 17c, the first insulating film 122 (an example of a second insulating film) below the electrode pads 17c, and the field plate electrode 124 (an example of the fourth electrode) below the electrode pads 17c extend in the X-direction (an example of a third direction).

Even when the direction in which trench 119 extends differs depending on the region, such as in semiconductor device 120, the warpage of semiconductor chip 10 can be suppressed better.

The semiconductor device 120 of the present embodiment can also provide the semiconductor device with improved reliability.

Fourth Embodiment

The semiconductor device of the present embodiment is different from the semiconductor device of the first embodiment in that a plurality of electrode pads which are not connected to the first connector is provided. Here, descriptions of the same contents as those of the first to third embodiments are omitted.

Figure 13:
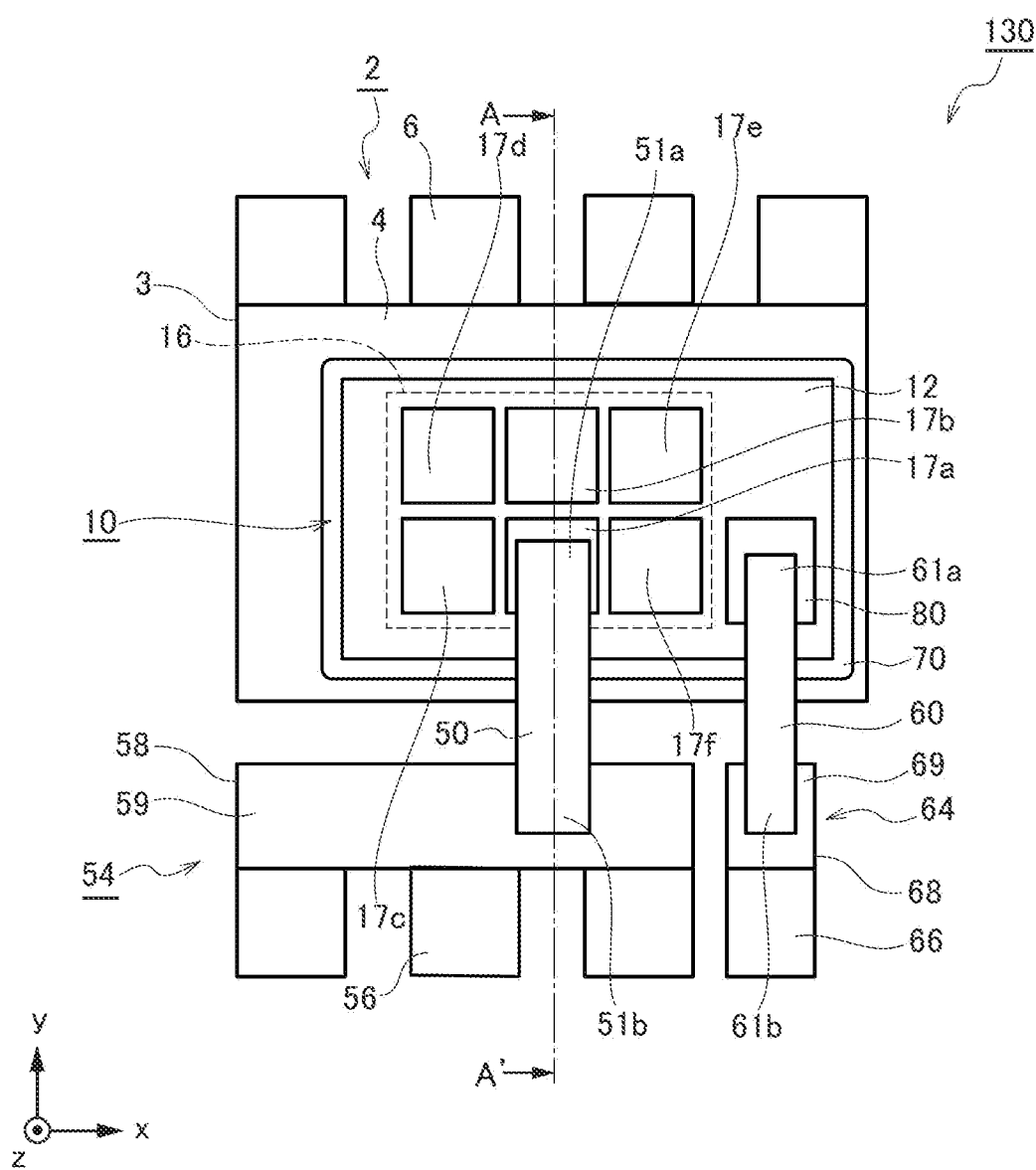
FIG. 13 is a schematic top view of a semiconductor device of the fourth embodiment.

FIG. 13 is a schematic top view of a semiconductor device 130 of the present embodiment. The electrode pad 17a is electrically connected to the first end 51a of the first connector 50. On the other hand, an electrode pad 17b, an electrode pad 17c, an electrode pad 17d, an electrode pad 17e and an electrode pad 17f are not electrically connected to the first connector 50.

The semiconductor device 130 of the present embodiment can also provide the semiconductor device with improved reliability.

Fifth Embodiment

The semiconductor device of the present embodiment is different from the semiconductor device of the fourth embodiment in that it includes a second connector connected to a plurality of electrode pads, and the electrode pads are not connected to the first connector. Here, descriptions of the same contents as those of the first to fourth embodiments are omitted.

Figure 14:
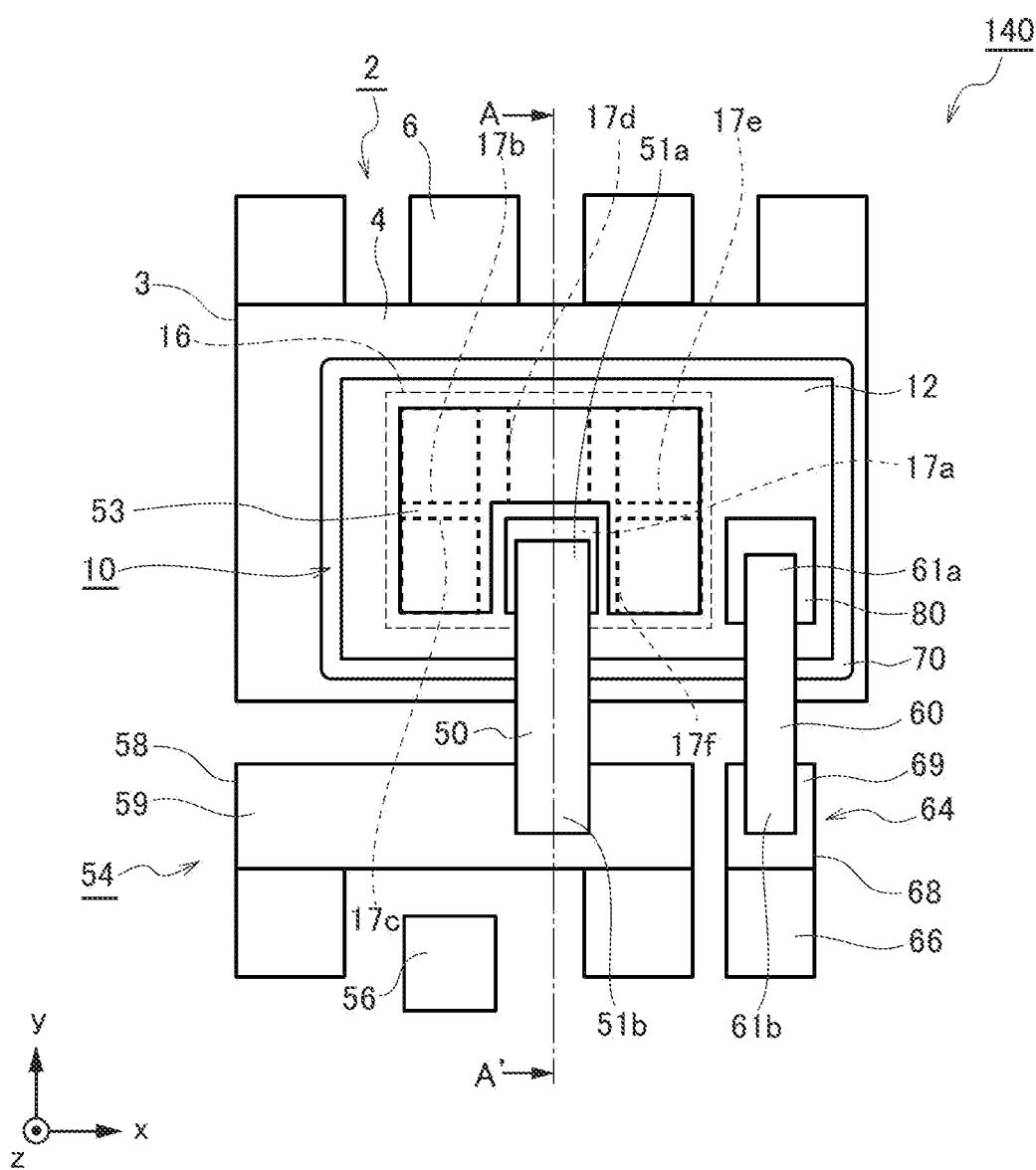
FIG. 14 is a schematic top view of a semiconductor device of the fifth embodiment.

FIG. 14 is a schematic top view of a semiconductor device 140 of the present embodiment. The second connector 53 is connected to the electrode pad 17b, the electrode pad 17c, the electrode pad 17d, the electrode pad 17e and the electrode pad 17f via the second bonding materials 20b, 20c, 20d, 20e and 20f (not illustrated). The semiconductor device 140 of the present embodiment includes a second connector (53) connected to the fourth bonding material (20) which is not connected to the first connector (50).

For example, when the first connector 50 is connected to the electrode pad 17a by reflow, when the melted bonding material is cured, the position of the first connector 50 may be shifted from the predetermined position and cured. By providing the second connector 53, such a shift is suppressed.

The semiconductor device 140 of the present embodiment can also provide the semiconductor device with improved reliability.

Sixth Embodiment

Figure 15:
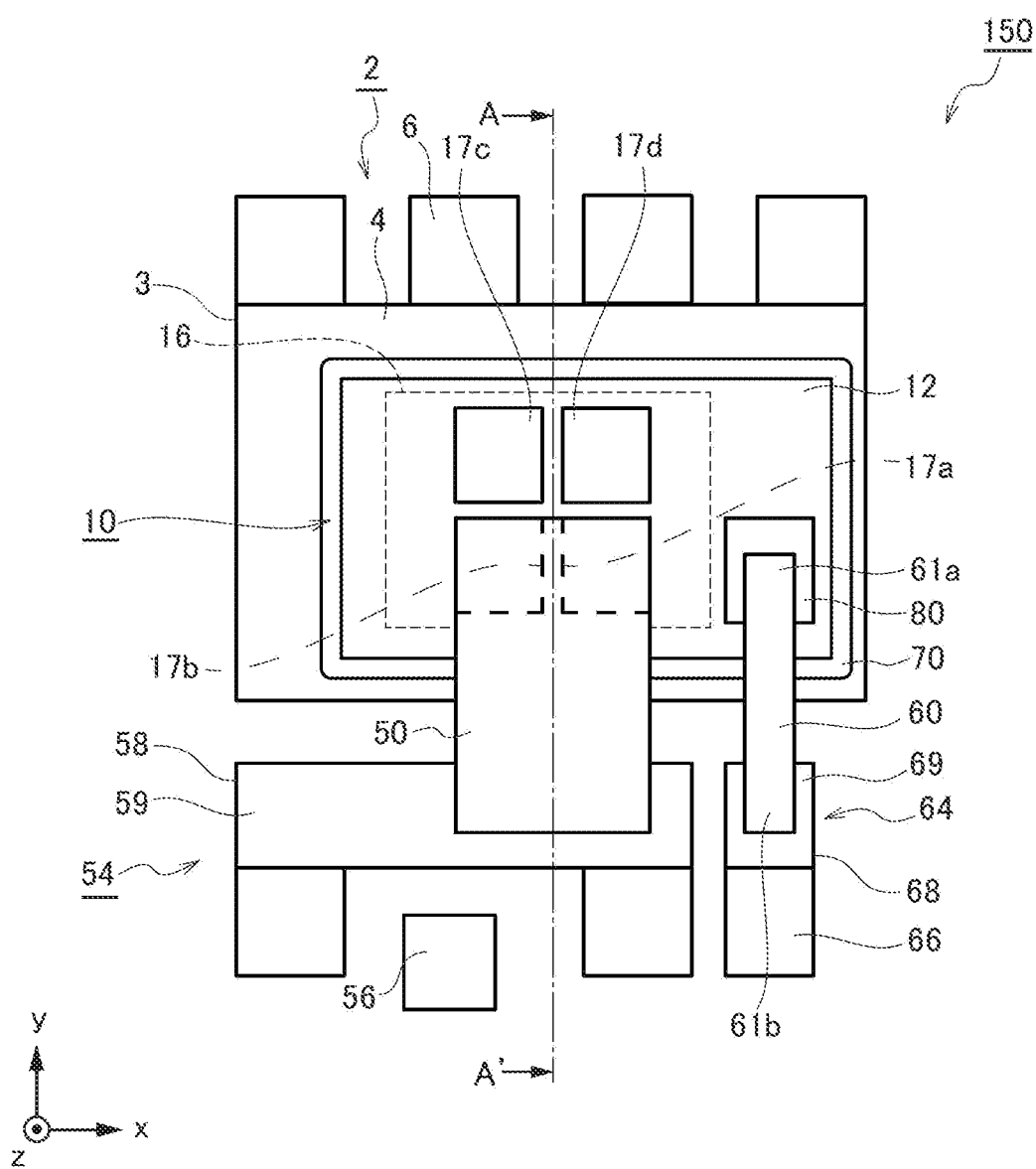
FIG. 15 is a schematic top view of a semiconductor device of the sixth embodiment.

FIG. 15 is a schematic top view of a semiconductor device 150 of the present embodiment. Descriptions overlapping with those of the first to fifth embodiments are omitted. The first connector 50 is connected to the electrode pad 17a and the electrode pad 17b. A connector and a wire are not connected to the electrode pad 17c and the electrode pad 17d.

The semiconductor device 150 of the present embodiment can also provide the semiconductor device with improved reliability.

Seventh Embodiment

Figure 16:
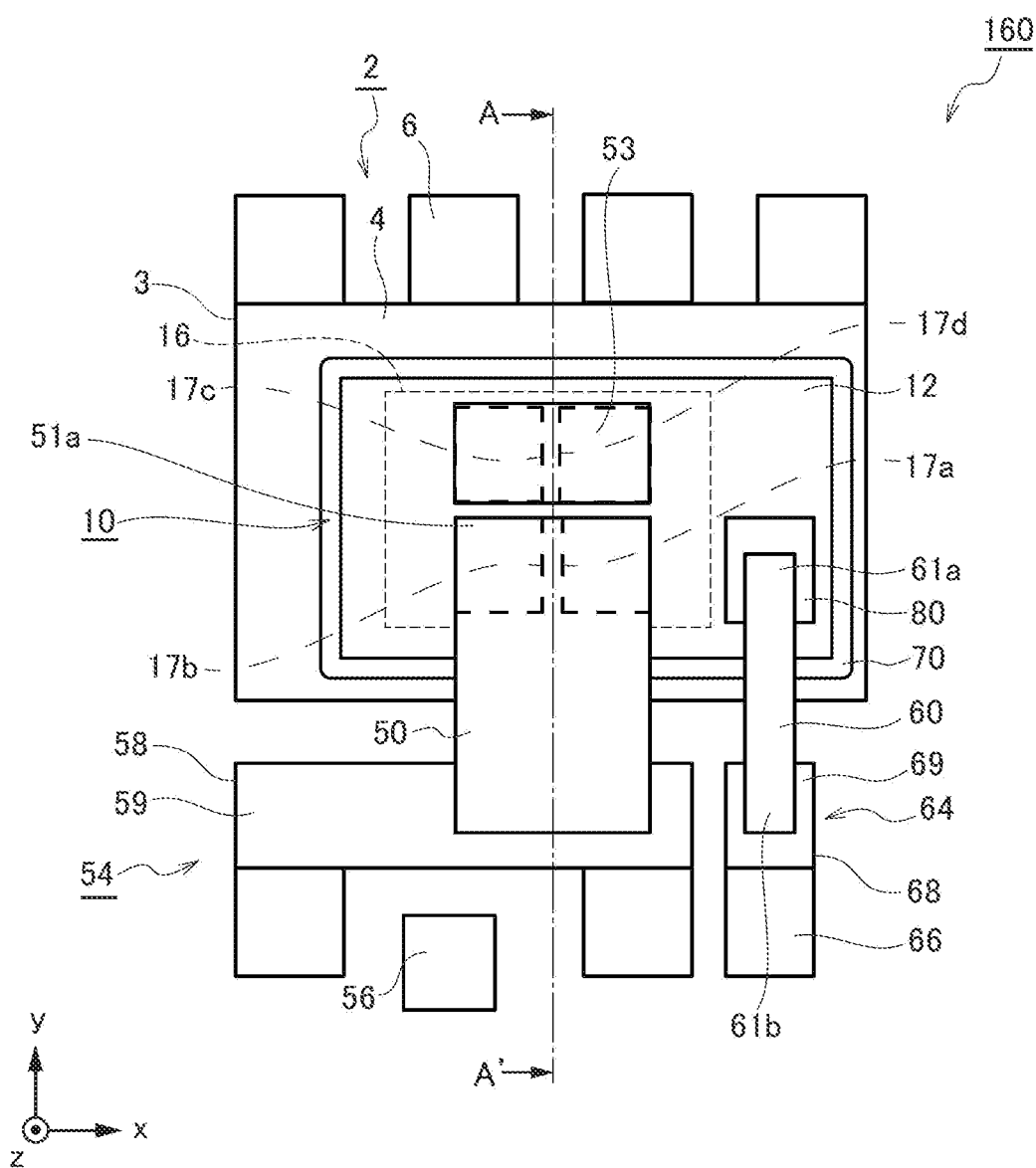
FIG. 16 is a schematic top view of a semiconductor device of the seventh embodiment.

FIG. 16 is a schematic top view of a semiconductor device 160 of the present embodiment. The description of the contents overlapping with the first embodiment to the sixth embodiment is omitted. The difference from the semiconductor device 150 shown in FIG. 15 is that the second connector 53 is connected to the electrode pad 17c and the electrode pad 17d.

The semiconductor device 160 of the present embodiment can also provide the semiconductor device with improved reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a lead frame;
   a first bonding material provided on the lead frame;
   a semiconductor chip provided on the first bonding material, the semiconductor chip including
      a lower surface,
      an upper surface,
      a first electrode provided on the lower surface, the first electrode being connected to the first bonding material,
      a second electrode provided on the upper surface, and
      a plurality of electrode pads connected to the second electrode, the plurality of electrode pads including a first electrode pad and a second electrode pad, and the first electrode pad and the second electrode pad being spaced apart from each other;
   a plurality of second bonding materials, each of the plurality of second bonding materials being provided on each of the plurality of electrode pads;

a first connector connected to at least one of the plurality of second bonding materials on the first electrode pad; and a third connector connected to a fourth bonding material, the fourth bonding material being electrically connected to a fifth electrode of the semiconductor chip, and the fourth bonding material not being connected to the first connector, wherein at least one of the plurality of second bonding materials on the second electrode pad which is not connected to the first connector and the third connector is not connected to a wire, wherein the first electrode pad and the second electrode pad are aligned in a fifth direction parallel to the upper surface, and wherein the first connector and the third connector are aligned in a sixth direction parallel to the upper surface and vertically intersecting the fifth direction.

2. The semiconductor device according to claim 1, wherein the semiconductor chip further includes a first semiconductor layer of first conductivity type provided on the first electrode, a first semiconductor region of second conductivity type provided on the first semiconductor layer, a second semiconductor region of first conductivity type provided on the first semiconductor region, the second electrode provided on the second semiconductor region, the second electrode being electrically connected to the second semiconductor region, and a third electrode provided in a first trench, the first trench reaching the first semiconductor layer from above the first semiconductor region, the third electrode facing the first semiconductor layer via a first insulating film, wherein the first trench extends in a first direction parallel to the upper surface, and wherein one of the plurality of electrode pads which is provided above the first trench and which is not connected to the first connector via one of the plurality of second bonding materials extends in a second direction, the second direction is parallel to the upper surface and intersects the first direction.

3. The semiconductor device according to claim 2, wherein the first connector is connected to at least two electrode pads of the plurality of electrode pads, and wherein the semiconductor device further comprising:

a conductive line connected to the third electrode, the conductive line being provided below between the two electrode pads of the plurality of electrode pads.

4. The semiconductor device according to claim 2, wherein the semiconductor chip further includes a fourth electrode provided in a second trench, the second trench reaching the first semiconductor layer from above the first semiconductor region, the fourth electrode facing the first semiconductor layer via a second insulating film, wherein the second trench extends in a third direction parallel to the upper surface and intersecting the first direction, and wherein one of the plurality of electrode pads which is provided above the second trench and which is not connected to the first connector via one of the plurality of second bonding materials extends in a fourth direction, the fourth direction is parallel to the upper surface and intersects the third direction.

5. The semiconductor device according to claim 1, wherein each of the first electrode pads includes Ni or Cu.

6. A semiconductor device comprising:

a lead frame;

a first bonding material provided on the lead frame;

a semiconductor chip provided on the first bonding material, the semiconductor chip including a lower surface, an upper surface, a first electrode provided on the lower surface, the first electrode being connected to the first bonding material, a second electrode provided on the upper surface, and a plurality of electrode pads connected to the second electrode, the plurality of electrode pads including a first electrode pad and a second electrode pad, the first electrode pad and the second electrode pad being spaced apart from each other;

a plurality of second bonding materials, each of the plurality of second bonding materials being provided on each of the plurality of electrode pads;

a first connector connected to at least one of the plurality of second bonding materials on the first electrode pad;

a third connector connected to a fourth bonding material, the fourth bonding material being electrically connected to a fifth electrode of the semiconductor chip, the fourth bonding material not being connected to the first connector; and a sealing resin provided on at least one of the plurality of second bonding materials on the second electrode pad, the at least one of the plurality of second bonding materials on the second electrode pad not being connected to the first connector and the third connector, wherein the first electrode pad and the second electrode pad are aligned in a fifth direction parallel to the upper surface, and wherein the first connector and the third connector are aligned in a sixth direction parallel to the upper surface and vertically intersecting the fifth direction.

7. The semiconductor device according to claim 6, further comprising:

a second connector connected to the at least one of the plurality of second bonding materials on the second electrode pad.

8. The semiconductor device according to claim 7, wherein the semiconductor chip further includes a first semiconductor layer of first conductivity type provided on the first electrode, a first semiconductor region of second conductivity type provided on the first semiconductor layer, a second semiconductor region of the first conductivity type provided on the first semiconductor region, the second electrode provided on the second semiconductor region, the second electrode being electrically connected to the second semiconductor region, and a third electrode provided in a first trench, the first trench reaching the first semiconductor layer from above the first semiconductor region, the third electrode facing the first semiconductor layer via a first insulating film, wherein the first trench extends in a first direction parallel to the upper surface, and wherein one of the plurality of electrode pads which is provided above the first trench and which is not connected to the first connector via one of the plurality of second bonding materials extends in a second direction which is parallel to the upper surface and which intersects the first direction.

9. The semiconductor device according to claim 8,
wherein the first connector is connected to at least two electrode pads of the plurality of electrode pads, and
wherein the semiconductor device further comprising:
a conductive line connected to the third electrode, the conductive line being provided below between the two electrode pads of the plurality of electrode pads.

10. The semiconductor device according to claim 8, wherein the semiconductor chip further includes
a fourth electrode provided in a second trench, the second trench reaching the first semiconductor layer from above the first semiconductor region, the fourth electrode facing the first semiconductor layer via a second insulating film,
wherein the second trench extends in a third direction parallel to the upper surface and intersecting the first direction, and
wherein one of the plurality of electrode pads which is provided above the second trench and which is not connected to the first connector via one of the plurality of second bonding materials extends in a fourth direction which is parallel to the upper surface and which intersects the third direction.

11. The semiconductor device according to claim 6, wherein each of the electrode pads includes Ni or Cu.

12. The semiconductor device according to claim 1, wherein the first connector and the third connector are hard connectors, and the first connector and the third connector are different from wires.

13. The semiconductor device according to claim 6, wherein the first connector and the third connector are hard connectors, and the first connector and the third connector are different from wires.

14. The semiconductor device according to claim 2, wherein the first direction is parallel to the fifth direction and the second direction is parallel to the sixth direction.

15. The semiconductor device according to claim 8, wherein the first direction is parallel to the fifth direction and the second direction is parallel to the sixth direction.

16. The semiconductor device according to claim 1, wherein the at least one of the plurality of second bonding materials on the second electrode pad which is not connected to the first connector and the third connector is not connected to a connector.

17. The semiconductor device according to claim 1, further comprising:
a second connector connected to the at least one of the plurality of second bonding materials on the second electrode pad.

* * * * *